United States Patent [19]

Miller

[11] 4,264,983

[45] Apr. 28, 1981

[54] TIME-MULTIPLEXED CCD TRANSVERSAL FILTER

[75] Inventor: Bruce E. Miller, Portland, Oreg.

[73] Assignee: Tektronix, Inc., Beaverton, Oreg.

[21] Appl. No.: 21,667

[22] Filed: Mar. 19, 1979

[51] Int. Cl.³ .................. H03H 15/02; H03H 9/52
[52] U.S. Cl. ............................ 364/825; 333/166; 364/862
[58] Field of Search .............. 364/602, 728, 825, 862; 333/150, 151, 165–168, 193–196

[56] References Cited

U.S. PATENT DOCUMENTS

| | | | |
|---|---|---|---|
| 3,942,034 | 3/1976 | Buss | 364/862 |
| 3,942,140 | 3/1976 | Laker et al. | 333/193 |
| 4,063,200 | 12/1977 | Mattern | 364/862 |
| 4,105,958 | 8/1978 | Pierce et al. | 333/166 |
| 4,120,035 | 10/1978 | Cases et al. | 364/825 |
| 4,121,296 | 10/1978 | Snijders et al. | 364/724 |

FOREIGN PATENT DOCUMENTS 509977  9/1976  U.S.S.R. .................. 364/862

OTHER PUBLICATIONS

Wooten: Build a Versatile Memory System that Accepts 4K or 16K RAM's, EDN Magazine, Feb. 20, 1978, pp. 85–90.

Primary Examiner—Felix D. Gruber
Attorney, Agent, or Firm—George T. Noe

[57] ABSTRACT

A time-multiplexed CCD transversal filter includes N filter sections each comprising N substantially identical CCD's connected in parallel. An N-phase clock is connected to each filter section to provide a sampling frequency $f_s$ which is N times the clock frequency $f_c$. The output taps of all the devices in a filter section are weighted in a predetermined manner and summed, and the outputs of all the filter sections are multiplexed to provide a continuously valid output.

2 Claims, 3 Drawing Figures

TIME-MULTIPLEXED CCD TRANSVERSAL FILTER

BACKGROUND OF THE INVENTION

Charge transfer transversal filters are well known in the art and are utilized in a variety of digital filtering applications. These devices are essentially discrete time sampled tapped analog delay lines. Predetermined mathematic weighting coefficients are assigned to each tap to provide a filter having predetermined characteristics with a finite impulse response. Node voltages which correspond to each tap are non-destructively sensed and combined with the weighting coefficients, then these voltages are summed to provide an output voltage. Each time the analog voltages are moved under clock control to a new tapped position, an output voltage is again computed, producing an output signal which is dependent upon the transfer function of the filter.

In a charge-coupled device (CCD), an input signal is iteratively sampled at a predetermined frequency $f_s$. Charge packets proportional to the amplitude values of the samples are formed in a potential well in the semiconductor material adjacent to a sampling gate, and these charge packets are moved from well to well along the CCD channel under the control of clock pulses which occur at a frequency $f_c$. Before a new sample can be taken each time, the first potential well must be cleared of the charge packet corresponding to the previous sample. Thus the clock frequency $f_c$ becomes a limiting factor for both sampling rate and operating speed of a single channel CCD. Correspondingly, since the minimum sampling rate, or Nyquist sampling rate, must be at least twice the frequency of the input signal, the frequency of the input signal is also limited.

SUMMARY OF THE INVENTION

In accordance with the present invention, a time-multiplexed CCD transversal filter is provided in which the sampling frequency is greater than the clock frequency, extending the frequency range over which the filter can be operated for a given CCD structure and clock frequency.

For $f_s = Nf_c$, where N represents the multiple of the clock frequency $f_c$ by which the sampling frequency $f_s$ is to exceed the clock frequency, the time-multiplexed CDD transversal filter is arranged in N groups of N substantially identical CCD's. For each group of N CCD's, an N-phase clock may be used for both sampling and clocking the devices. All of the output taps of all of the devices in the group are weighted and summed; however, since the charge packets being moved along the CCD channels remain at each tapped position for a complete clock cycle, the overall summed output for a given group of N CCD's is valid for only 1/N cycle. Therefore, N such groups are required to provide an output that is valid at all times.

The weighting coefficients are distributed among the taps of the multiple CCD's in such a manner as to effect the transfer function of the filter by ensuring a properly weighted output at each tap, since the output at each tap becomes valid in a sequence determined by the clocking arrangement.

CCD transversal filters in which N=2 or higher are useful in digital signal processing applications such as digital oscilloscopes or television monitors.

It is therefore one object of the present invention to provide a novel time-multiplexed CCD transversal filter.

It is another object to provide a CCD transversal filter for which the sampling frequency exceeds the clock frequency of the CCD's, extending the useful frequency range of the filter.

Other objects and advantages will become apparent to those having ordinary skill in the art upon a reading of the following description when taken in conjunction with the accompanying drawings.

DETAILED DESCRIPTION OF THE INVENTION

Figure 1:
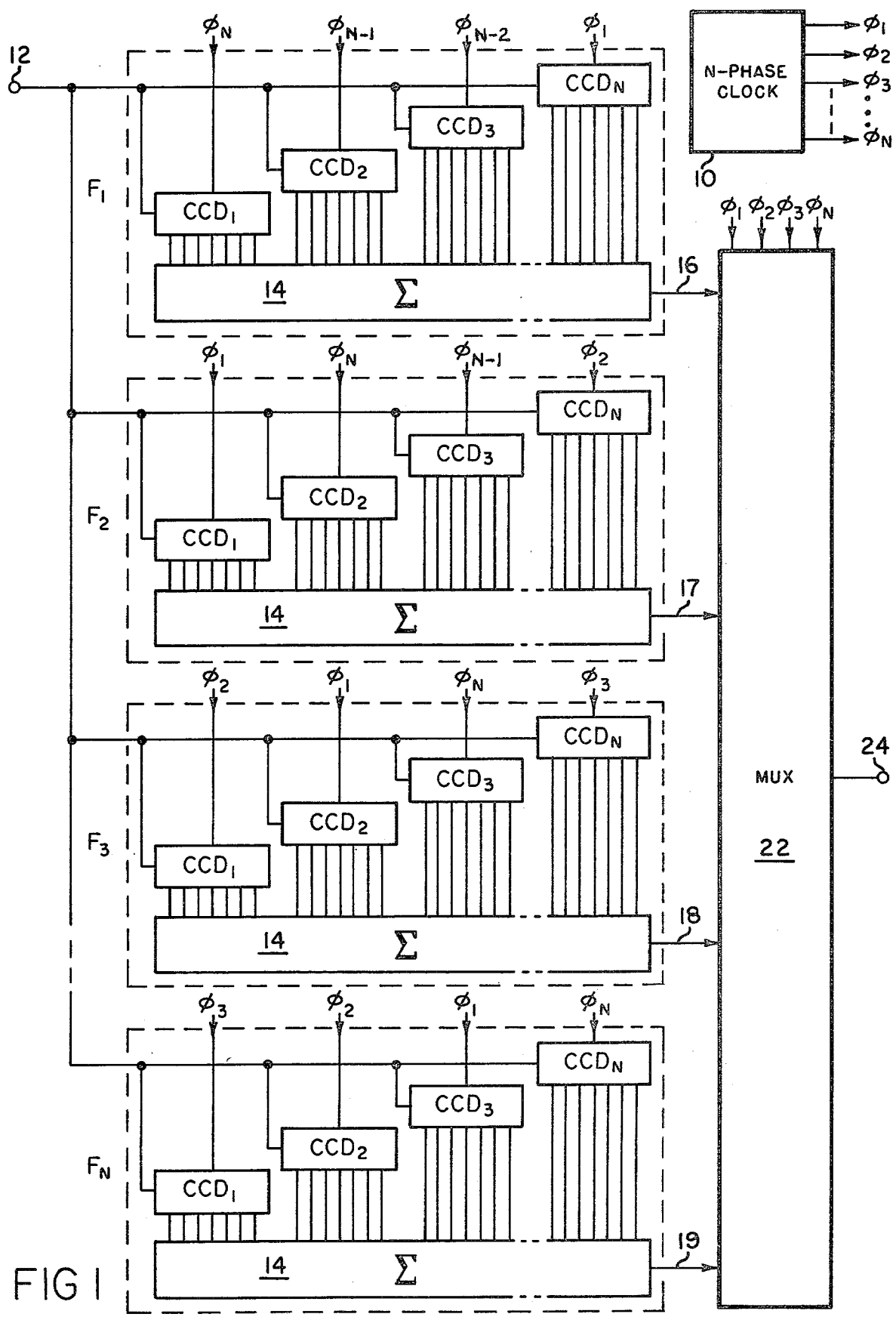
FIG. 1 shows a block diagram of a general time-multiplexed CCD transversal filter in accordance with the present invention.

Turning now to the drawings, there is shown in FIG. 1 a block diagram of a time-multiplexed CCD transversal filter for which $f_s = Nf_c$, where N represents the multiple of the clock frequency $f_c$ by which the sampling frequency $f_s$ is to exceed the clock frequency. An N-phase clock 10 produces clock signals designated $\phi_1$, $\phi_2$, $\phi_3$, ..., $\phi_N$ for operation of the filter. All of these clock signals are produced at the same frequency, $f_c$; however, they are staggered in phase by N/360 degrees. For example, for N=4, clock signals $\phi_1$, $\phi_2$, $\phi_3$, and $\phi_4$ have the same frequency $f_c$ and the phase shift between any two consecutive clock signals, such as $\phi_1$ and $\phi_2$, is 90 degrees. It must be understood at this point that the N-phase clock signals do not represent the clock phases required to move a charge packet along a single CCD channel. For that purpose, each clock signal $\phi_1$, $\phi_2$, ..., $\phi_N$ may be split into the number phases required by a particular CCD design.

The transversal filter comprises N substantially identical filter sections designated $F_1$, $F_2$, $F_3$, ..., $F_N$. Each filter section includes N substantially identical CCD's designated $CCD_1$, $CCD_2$, $CCD_3$, ..., $CCD_N$. These CCD's are conventional devices in which an analog signal is iteratively sampled, and charge packets proportional to the instantaneous amplitude values of the signal are formed in a potential well in the semiconductor material adjacent to a sampling gate. The charge packets are moved from position to position along the CCD channel under the control of clock pulses. At each position, the charge packets are non-destructively sensed and combined with tap weights which are predetermined in accordance with the characteristics of a particular filter. The sensing and weighting operation may be accomplished by the use of any of a number of well-known standard techniques, including the use of split electrodes or analog amplifiers or multipliers. It should be pointed out, however, that each filter section, rather than having a single CCD with M taps, has N CCD's, each of which has M/N taps. In other words, the number of filter taps for each filter section is M irrespective of the number of CCD's; however, since the M taps are divided among N CCD's, the tap weights must be assigned among the N CCD's in the order in which the CCD's will be clocked. This will become clear later when the circuit operation is discussed.

An analog signal is applied via an input terminal 12 to all of the CCD's in all of the filter sections. Each filter section includes a summing device 14 for summing the weighted outputs of the CCD's. The outputs from summing devices 14 of filter sections $F_1, F_2, F_3, \ldots, F_N$ are applied via output lines 16, 17, 18, and 19, respectively, to a multiplexer (MUX) 22. The overall filter output is available at an output terminal 24.

Figure 2:
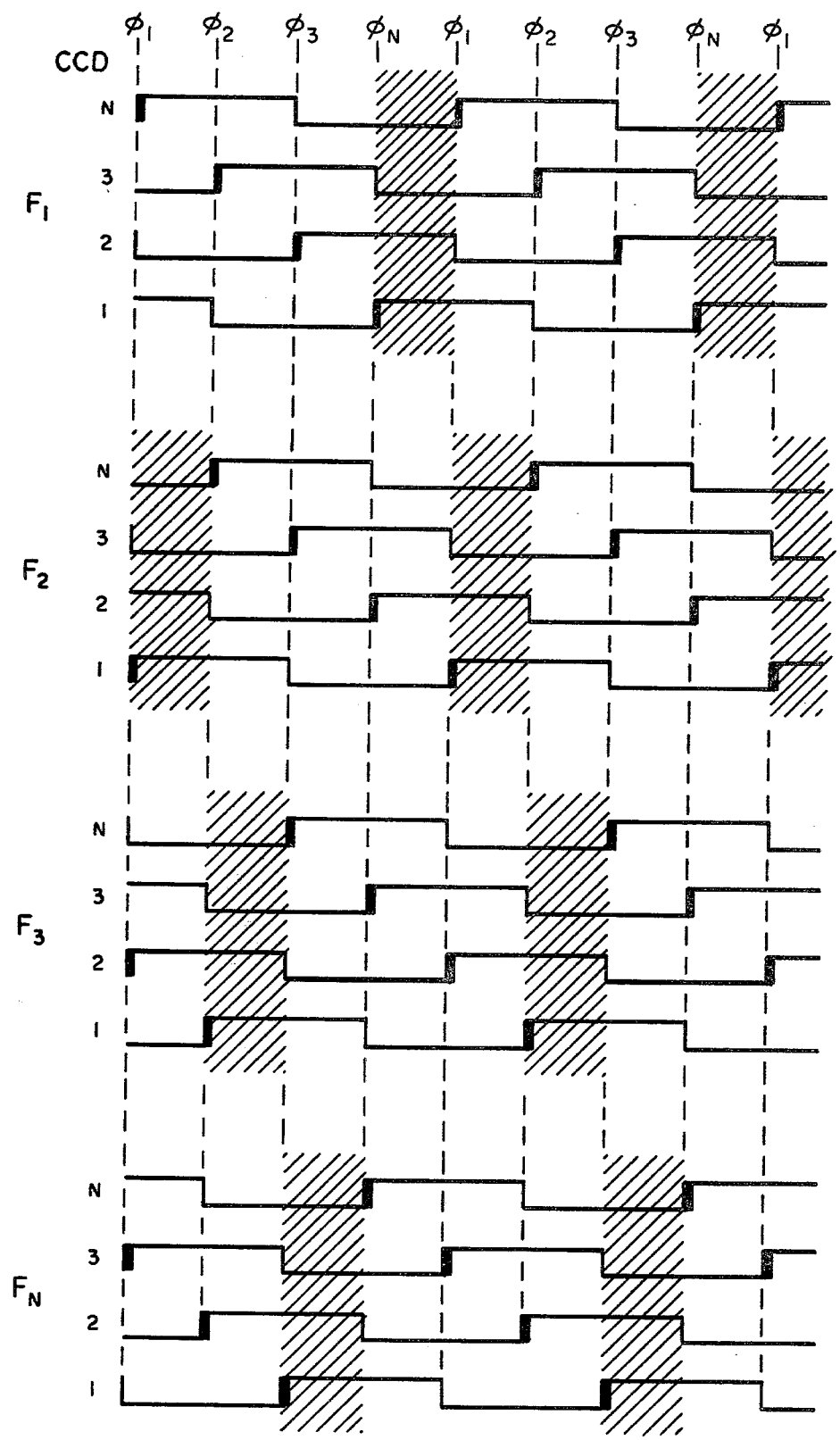
FIG. 2 shows a timing diagram of the output validity of the CCD transversal filter of FIG. 1.

The clock signals from N-phase clock 10 are applied to the N CCD's in each filter section in such a manner that each CCD receives a different phase of the clock. This can best be understood in connection with FIG. 2, wherein a timing diagram of the various clock phases applied to the CCD's of filter sections $F_1, F_2, F_3, \ldots, F_N$ is shown. It is assumed for purposes of discussion that the input analog signal is sampled on the leading edge of each clock pulse. Taking filter section $F_1$ as an example, it can be seen in FIG. 1 that clock phase $\phi_1$ is applied to $CCD_N$, $\phi_{N-2}$ to $CCD_3$, $\phi_{N-1}$ to $CCD_2$, and $\phi_N$ to $CCD_1$. Therefore, on the rising edge of clock signal $\phi_1$, $CCD_N$ takes a sample and holds the sample one complete cycle before shifting it to the next position in the CCD channel. Likewise, $CCD_3$ takes a sample on the rising edge of clock signal $\phi_2$. The sampling process continues until finally $CCD_1$ has taken a sample on the rising edge of clock signal $\phi_N$. When this occurs, all of the CCD's in filter section $F_1$ have acquired a sample and therefore the tapped outputs to the summation device 14, and consequently the output on line 16, are valid until $CCD_N$ takes a new sample on the rising edge of clock signal $\phi_1$. The period of validity $\phi_N - \phi_1$ of filter section $F_1$ is indicated by the closely-spaced diagonal lines in FIG. 2. A perusal now of filter sections $F_2$, $F_3$, and $F_N$ shows that the clock phases are shifted for each so that the period of validity for filter section $F_2$ is $\phi_1 - \phi_2$; for $F_3$, $\phi_2 - \phi_3$; and for $F_N$, $\phi_{N-1} - \phi_N$. That is, the output for each filter section is valid between the period that $CCD_1$ takes its sample and until $CCD_N$ takes its next sample. Each clock phase $\phi_1$ through $\phi_N$ is applied to multiplexer 22 to route the valid filter outputs to output terminal 24 so that a valid output is always available. It can be discerned that for a given clock cycle, e.g., from $\phi_1$ to the next occurence of $\phi_1$, in FIG. 2, N samples are taken and N filter section outputs are multiplexed to provide a continuously valid output. Thus, the sampling frequency $f_s = N$ times the clock frequency $f_c$.

Figure 3:
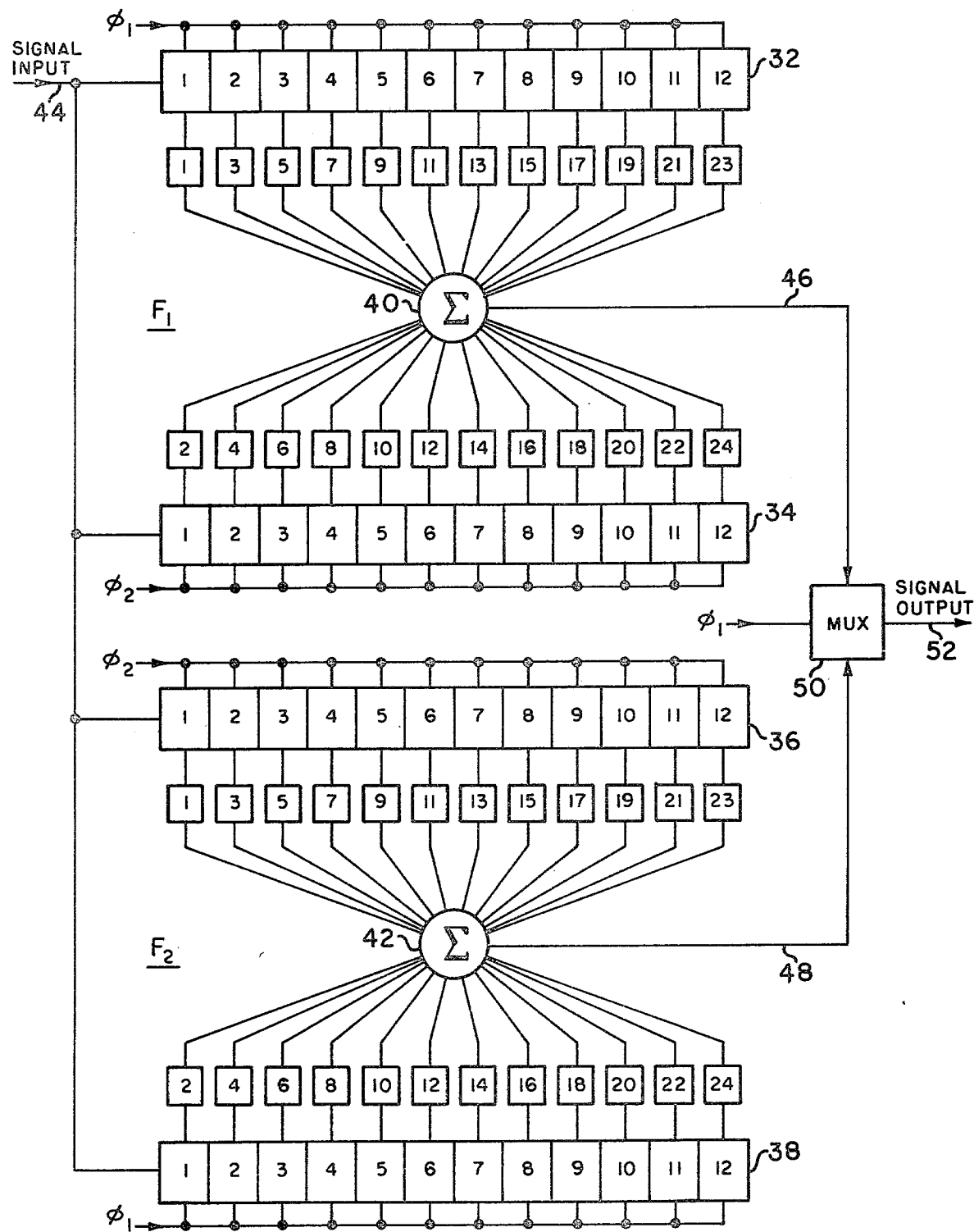
FIG. 3 shows a schematic diagram of a time-multiplexed CCD transversal filter in which the sampling frequency is twice the CCD clock frequency.

A time multiplexed CCD transversal filter for which $N=2$ is shown in FIG. 3. Here a symmetrical clock input is split into two phases $\phi_1$ and $\phi_2$ by an inverter 30, clock signals $\phi_1$ and $\phi_2$ being 180 degrees out of phase. In this embodiment, two filter sections $F_1$ and $F_2$ are provided. The four CCD's 32, 34, 36, and 38 are substantially identical. For purposes of discussion, each CCD is shown with twelve taps which are numbered 1 through 12 to provide a total of 24 taps for each filter section. The assignment of tap weights is illustrated by the boxes containing a tap number connected to each CCD tap. Note that in the case of an $N=2$ system, CCD's 32 and 36 are assigned the odd-numbered taps while CCD's 34 and 38 are assigned the even-numbered taps. As mentioned before, the actual sensing and weighting of the charge packets in the CCD channels may be accomplished by the use of conventional split electrode techniques or by the use of analog multipliers or amplifiers. The weighted taps of CCD's 32 and 34 of filter section $F_1$ are connected to a summing device 40. Similarly, the weighted taps of CCD's 36 and 38 of filter section $F_2$ are connected to a summing device 42. Summing devices 40 and 42 suitably may be any conventional summing device, depending upon whether the tapped and weighted CCD outputs are current or voltage signals.

An input signal to be filtered is applied to all four CCD's via input line 44. The outputs of summing devices 40 and 42 are applied via output lines 46 and 48, respectively, to a multiplexer 50. The time-multiplexed CCD transversal filter output is available on output line 52.

Clock signal $\phi_1$ is applied to each of the twelve taps of CCD's 32 and 38, while clock signal $\phi_2$ is applied to each of the twelve taps of CCD's 34 and 36. As mentioned earlier, it should be understood that clock signals $\phi_1$ and $\phi_2$ may be further split into as many phases as required by the type of CCD's used to move charge packets along the channels. Some CCD's require a 3-phase or a 4-phase clock; however, this aspect of the clocking is not germane to this description, and $\phi_1$ and $\phi_2$ are described as single-phase clock signals to maintain simplicity of this discussion.

Again, it is assumed that sampling of the input signal is coincident with the positive-going or rising edge of the clock signal for each CCD. Looking for the moment at filter section $F_1$, CCD 32 takes a sample on the rising edge of clock signal $\phi_1$ and all of the charge packets within the CCD are shifted one position along the channel. While the outputs on the "odd" taps are weighted and summed, the output on line 46 is invalid at this point because the "even" taps of CCD 34 have not yet been shifted. On the rising edge of clock signal $\phi_2$, CCD 34 takes a sample and shifts all of the charge packets along the channel, and now the weighted "even" tapped outputs are valid, so that all 24 taps are summed and the output on line 46 is valid. This valid output is issued by multiplexer 50 to output line 52.

Since the output of filter section $F_1$ is valid for only one-half of a clock cycle, that is, the half cycle that clock signal $\phi_2$ is positive, filter section $F_2$ provides a valid output on the other half cycle. For this case, the structure of filter section $F_2$ is identical to that of filter section $F_1$, but is clocked 180 degrees out of phase. Therefore, clock signal $\phi_2$ is applied to CCD 36 while clock signal $\phi_1$ is applied to CCD 38. The weighted and summed output on line 48 is valid during the half cycle that clock signal $\phi_1$ is positive.

While the invention has been particularly shown and described with reference to the embodiments thereof, it will be understood by those skilled in the art that the foregoing and other changes in form and detail may be made without departing from the spirit and scope of the invention.

What I claim as being novel is:

1. A time-multiplexed CCD transversal filter, comprising:
 a plurality of filter sections, each filter section comprising a plurality of charge coupled devices defining serially arranged delay elements, a tap coupled to each delay element for detecting the magnitude of charge therein and for weighting the detected signals with predetermined weighting values, and means for summing said weighted signals to produce a summed output from each filter section;
 a multi-phase clock source for producing a plurality of clock signals having a predetermined frequency and different predetermined phases of a single clock cycle;

said clock signals being applied to said plurality of filter sections in such a manner that each charge coupled device in each filter section receives a different phase of said clock signal so that said charge coupled devices are clocked in a predetermined consecutive order, the output of each filter section being valid only during the period between the last clock signal of a clock cycle and the first signal of the next clock cycle; and means for multiplexing said outputs of said filter sections to provide an output that is valid over a complete cycle.

2. A time-multiplexed CCD transversal filter in accordance with claim 1 wherein each filter section comprises N charge coupled devices connected in parallel, and said multi-phase clock source produces N clock signals having the same frequency $f_c$ and consecutively shifted in phase by 1/N over a clock cycle, whereby for each filter section the sampling frequency $f_s = Nf_c$.

* * * * *